US006949391B2

(12) United States Patent
You

(10) Patent No.: US 6,949,391 B2
(45) Date of Patent: Sep. 27, 2005

(54) METHOD OF FABRICATING BOTTOM-GATED POLYCRYSTALLINE SILICON THIN FILM TRANSISTOR

(75) Inventor: JaeSung You, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/843,569

(22) Filed: May 12, 2004

(65) Prior Publication Data

US 2004/0266082 A1 Dec. 30, 2004

(30) Foreign Application Priority Data

Jun. 25, 2003 (KR) .............................. 10-2003-0041696

(51) Int. Cl.[7] .............................................. H01L 21/00
(52) U.S. Cl. ....................................... 438/30; 438/149
(58) Field of Search .......................... 438/30, 149, 151, 438/160, 166, 174, 181, 194, 197, 198, 289, 308

(56) References Cited

U.S. PATENT DOCUMENTS 5,530,265 A * 6/1996 Takemura .................... 257/66
5,773,844 A * 6/1998 Kawamura et al. ........... 257/57
6,323,521 B1 * 11/2001 Seo .............................. 257/347
6,331,717 B1 * 12/2001 Takemura .................... 257/512
6,437,366 B1 * 8/2002 Takemura .................... 257/51
6,500,703 B1 * 12/2002 Takemura .................... 438/158
6,683,666 B1 * 1/2004 Jang et al. ................... 349/113

OTHER PUBLICATIONS

James S. Im, et al. "Single–Crystal Si Films For Thin–Film Transistor Devices." *Applied Physics Letters*. vol. 70, No. 25, Jun. 23, 1997, pp. 3434–3436.

* cited by examiner

*Primary Examiner*—David Nhu
(74) *Attorney, Agent, or Firm*—McKenna Long & Aldridge LLP

(57) ABSTRACT

A method of forming a thin film transistor includes forming a gate electrode on a substrate, forming a gate insulating layer on the gate electrode, forming an amorphous silicon layer on the gate insulating layer, crystallizing the amorphous silicon layer within an active region corresponding to the gate electrode to form a polycrystalline silicon layer, etching the amorphous silicon layer such that an etch rate of amorphous silicon is greater than an etch rate of polycrystalline silicon to form a semiconductor layer of polycrystalline silicon in the active region, and forming source and drain electrodes on the semiconductor layer.

18 Claims, 13 Drawing Sheets backlight

METHOD OF FABRICATING BOTTOM-GATED POLYCRYSTALLINE SILICON THIN FILM TRANSISTOR

The present application claims the benefit of Korean Patent Application No. 2003-41696, filed in Korea on Jun. 25, 2003, which is hereby incorporated by reference.

BACKGROUND OF THE INVENTION

1. Field of the Invention

The present invention relates to a thin film transistor (TFT) for a display device, and more particularly, to a method of fabricating a bottom-gated polycrystalline silicon TFT.

2. Discussion of the Related Art

In general, TFTs are used as switching elements for liquid crystal display (LCD) devices. Of the different types of LCD devices, active matrix LCD (AM-LCD) devices are used because of their high resolution and superiority in displaying moving images. An LCD device includes two substrates disposed such that respective electrodes of the two substrates face into each other, and a liquid crystal layer is interposed between the respective electrodes. When a voltage is supplied to the electrodes, an electric field is induced to the liquid crystal layer, thereby modulating light transmittance of the liquid crystal layer by reorienting liquid crystal molecules of the liquid crystal layer to display images.

FIG. 1 is a schematic perspective view of a liquid crystal display device according to the related art. In FIG. 1, first and second substrates 10 and 30 face and are spaced apart from each other, wherein a plurality of gate lines 12 and a plurality of data lines 14 are formed on an inner surface of the first substrate 10 to cross each other. Accordingly, a pixel region "P" is defined by the crossings of the gate line 12 and the data line 14, and a pixel electrode 16 is formed in the pixel region "P." In addition, a TFT "T" is connected to the gate line 12 and the data line 14, and a color filter layer 32 and a common electrode 34 are sequentially formed on an inner surface of the second substrate 30. The color filter layer 32 transmits only light having a specific wavelength range. A liquid crystal layer 50 is interposed between the pixel electrode 16 and the common electrode 34, and first and second polarizing plates 52 and 54 are disposed along exterior surfaces of the first and second substrates 10 and 30, respectively. In addition, a backlight unit is disposed outside the first polarizing plate 52 to function as a light source.

In FIG. 1, the TFT "T" is used as a switching element turning ON/OFF to provide a voltage transmitted along the data line 14 to the pixel electrode 16. Accordingly, the TFT "T" determines display characteristics of the LCD device.

FIGS. 2A to 2I are schematic cross sectional views of a method of fabricating a thin film transistor for a liquid crystal display device according to the related art. In FIGS. 2A to 2I, a bottom-gated type thin film transistor is shown. Since a gate insulating layer, an amorphous silicon layer, and an impurity-doped amorphous silicon layer are sequentially formed in a vacuum chamber, the bottom-gated type thin film transistor has excellent electric properties and simplified fabricating processes.

In FIG. 2A, a first metal layer 72 is formed on a substrate 70.

In FIG. 2B, a first photoresist (PR) pattern 74 is formed on the first metal layer 72 through photolithographic processes. Although not shown in FIG. 2B, the photolithographic processes for forming the first PR pattern 74 includes steps of forming a PR layer on the first metal layer 72, disposing a mask having an open portion over the PR layer, exposing the PR layer through the mask and developing the exposed PR layer.

In FIG. 2C, the first metal layer 72 is etched using the first PR pattern 74 as an etching mask. Then, the PR pattern 74 is removed to form a gate electrode 76.

In FIG. 2D, a gate insulating layer 78, an intrinsic amorphous silicon layer 80, and an impurity-doped amorphous silicon layer 82 are sequentially formed on the gate electrode 76.

In FIG. 2E, a second PR pattern 84 is formed on the impurity-doped amorphous silicon layer 82. The second PR pattern 84 may be formed through photolithographic processes similar to processes used for the first PR pattern 74 (in FIG. 2B).

In FIG. 2F, the impurity-doped amorphous silicon layer 82 and the intrinsic amorphous silicon layer 80 are etched using the second PR pattern 84 as an etching mask to form a semiconductor layer 86 corresponding to the second PR pattern 84. The semiconductor layer 86 includes an active layer 86a of the etched intrinsic amorphous silicon layer 80 and an ohmic contact layer 86b of the etched impurity-doped amorphous silicon layer 82.

In FIG. 2G, a second metal layer 88 is formed on the semiconductor layer 86.

In FIG. 2H, third PR patterns 90a and 90b are formed on the second metal layer 88 over the semiconductor layer 86. The third PR patterns 90a and 90b are spaced apart from each other.

In FIG. 2I, source and drain electrodes 92 and 94 corresponding to the third PR patterns 90a and 90b are formed by etching the second metal layer 88 using the third PR patterns 90a and 90b as an etching mask. The ohmic contact layer 86b exposed between the source and drain electrodes 92 and 94 is removed using the source and drain electrodes 92 and 94 as an etching mask, thereby exposing a channel region "ch" of the active layer 86a. The gate electrode 76, the semiconductor layer 86, the source electrode 92, and the drain electrode 94 constitute a thin film transistor (TFT) "T."

According to the related art, a patterning process for a semiconductor layer of a bottom-gated type amorphous silicon TFT includes steps of coating a PR layer, exposing the PR layer, and developing the exposed PR layer. Accordingly, each individual fabrication process and process time increases production costs and reduces production yield.

SUMMARY OF THE INVENTION

Accordingly, the present invention is directed to a method of fabricating a bottom-gated type polycrystalline silicon TFT that substantially obviates one or more of the problems due to limitations and disadvantages of the related art.

An object of the present invention is to provide a method of forming a bottom-gated type polycrystalline silicon thin film transistor having reduced fabricating processes.

Another object of the present invention is to provide a method of forming a bottom-gated type polycrystalline silicon thin film transistor using polycrystalline silicon having an etch rate difference between polycrystalline silicon and amorphous silicon.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a thin film transistor includes forming a gate electrode on a substrate, forming a gate insulating layer on the gate electrode, forming an amorphous silicon layer on the gate insulating layer, crystallizing the amorphous silicon layer within an active region corresponding to the gate electrode to form a polycrystalline silicon layer, etching the amorphous silicon layer such that an etch rate of amorphous silicon is greater than an etch rate of polycrystalline silicon to form a semiconductor layer of polycrystalline silicon in the active region, and forming source and drain electrodes on the semiconductor layer.

In another aspect, a method of fabricating a liquid crystal display device includes forming a gate electrode and a gate line connected to the gate electrode on a first substrate, forming a gate insulating layer on the gate electrode and the gate line, forming an amorphous silicon layer on the gate insulating layer, crystallizing the amorphous silicon layer in an active region corresponding to the gate electrode to form a polycrystalline silicon layer, etching the amorphous silicon layer such that an etch rate of amorphous silicon is greater than an etch rate of polycrystalline silicon to form a semiconductor layer of polycrystalline silicon in the active region, forming source and drain electrodes on the semiconductor layer and a data line connected to the source electrode, forming a passivation layer on the source electrode, the drain electrode, and the data line, forming a pixel electrode on the passivation layer, forming a black matrix on a second substrate, forming a color filter layer on the black matrix, forming a common electrode on the color filter layer, attaching the first substrate and the second substrate such that the pixel electrode faces the common electrode, and forming a liquid crystal layer between the pixel electrode and the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate an embodiment of the present invention and together with the description serve to explain the principles of that invention. In the drawings.

DETAILED DESCRIPTION OF THE PREFERRED EMBODIMENTS

Reference will now be made in detail to the preferred embodiments of the present invention, examples of which are shown in the accompanying drawings.

Figure 1:
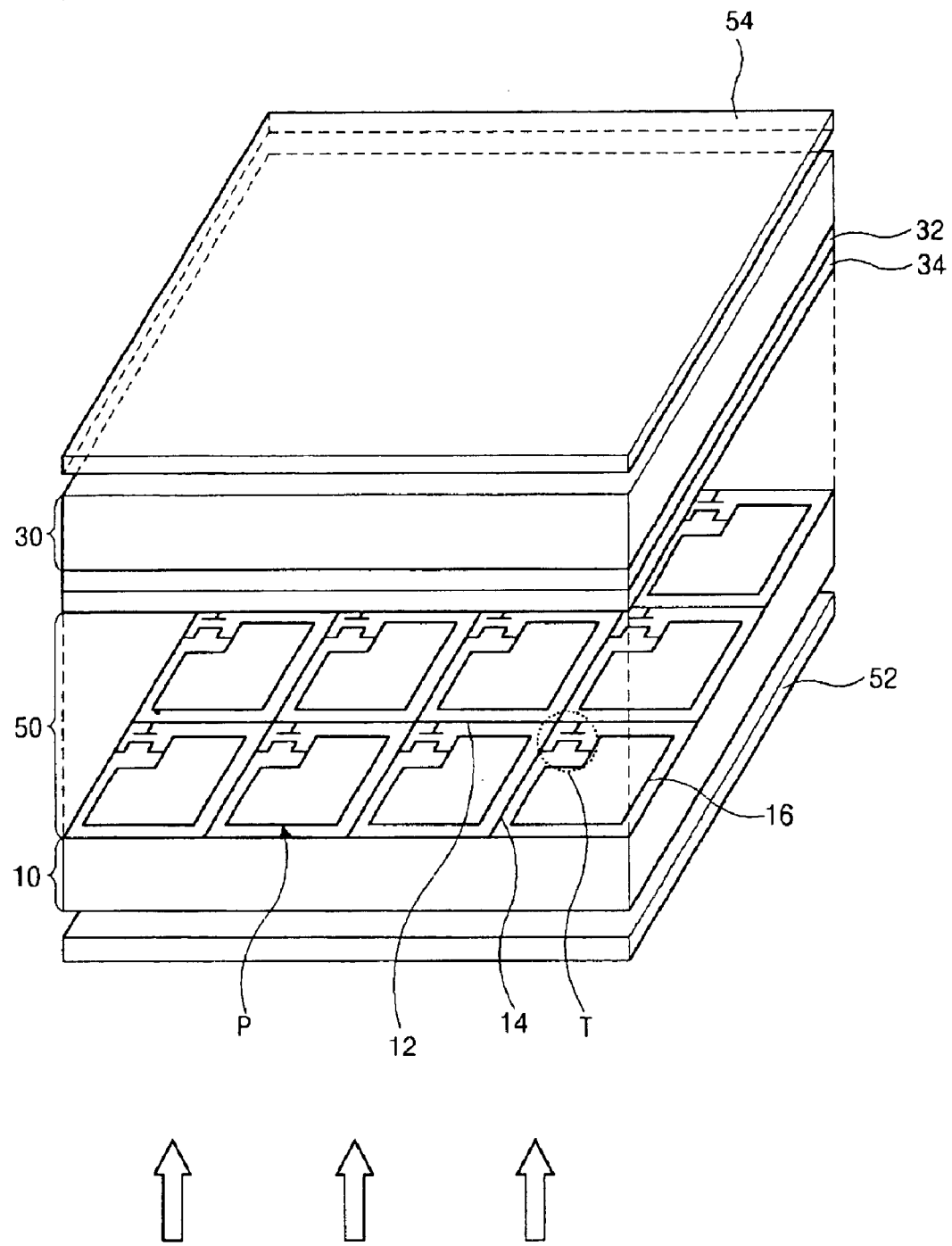
FIG. 1 is a schematic perspective view of a liquid crystal display device according to the related art.
Figure 2A:
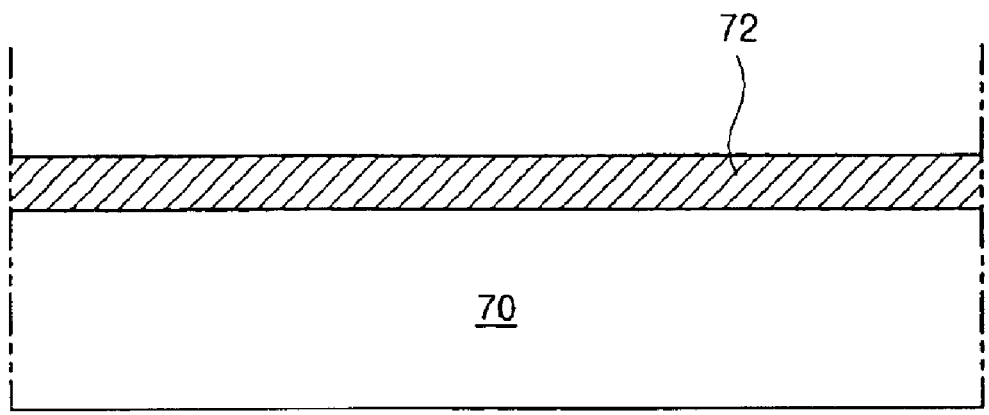
FIGS. 2A to 2I are schematic cross sectional views of a method of fabricating a thin film transistor for a liquid crystal display device according to the related art.
Figure 2B:
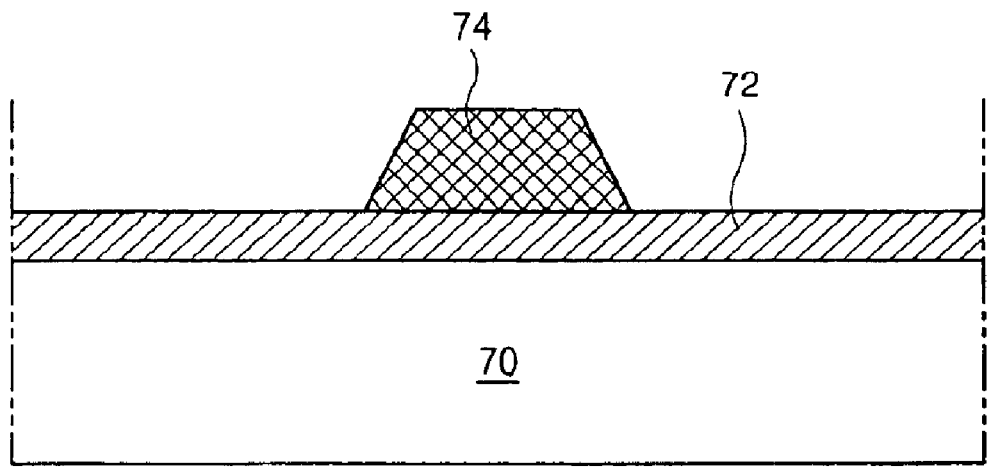
Figure 2C:
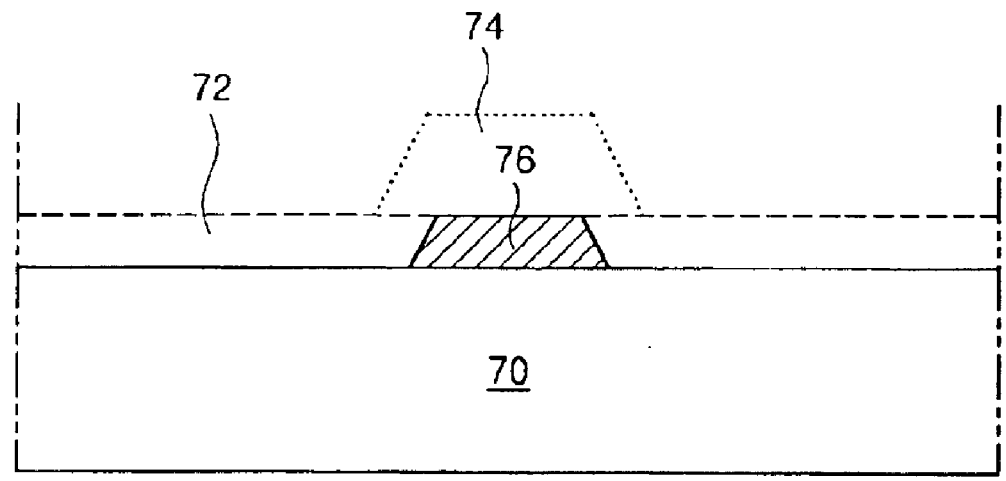
Figure 2D:
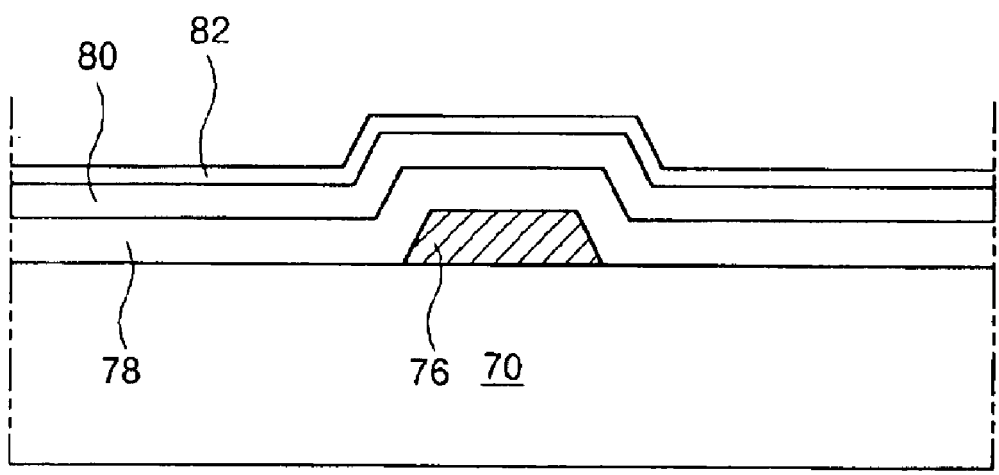
Figure 2E:
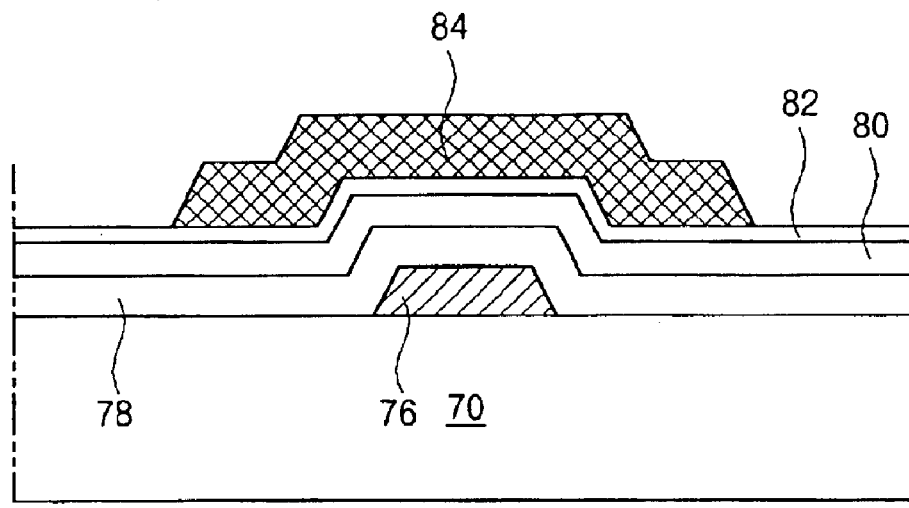
Figure 2F:
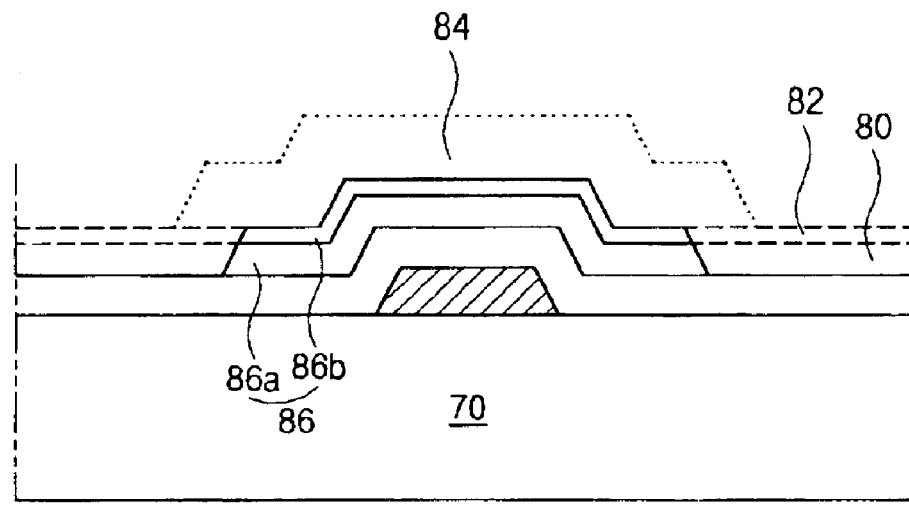
Figure 2G:
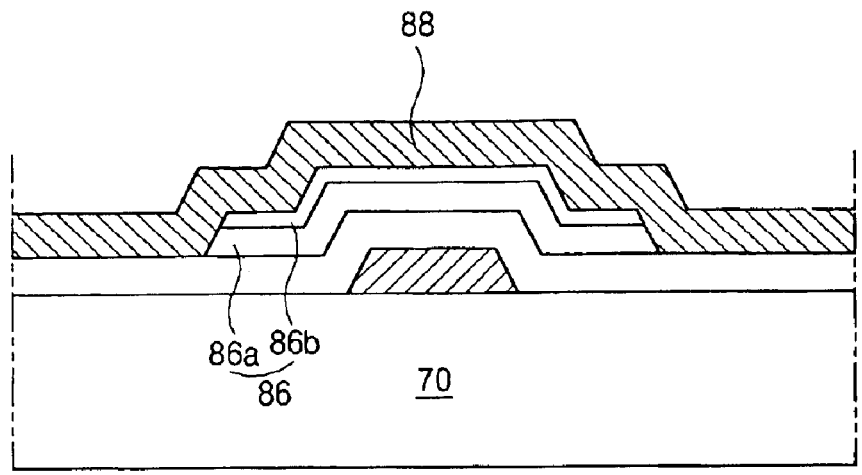
Figure 2H:
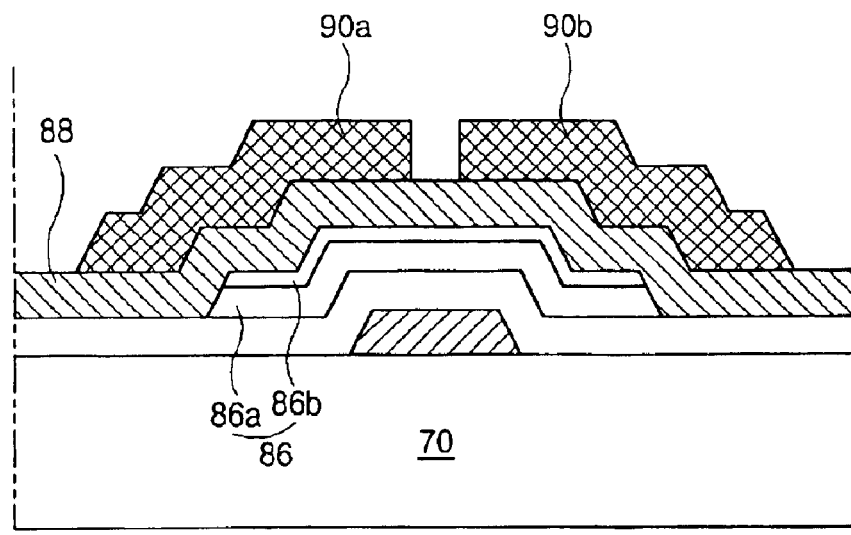
Figure 2I:
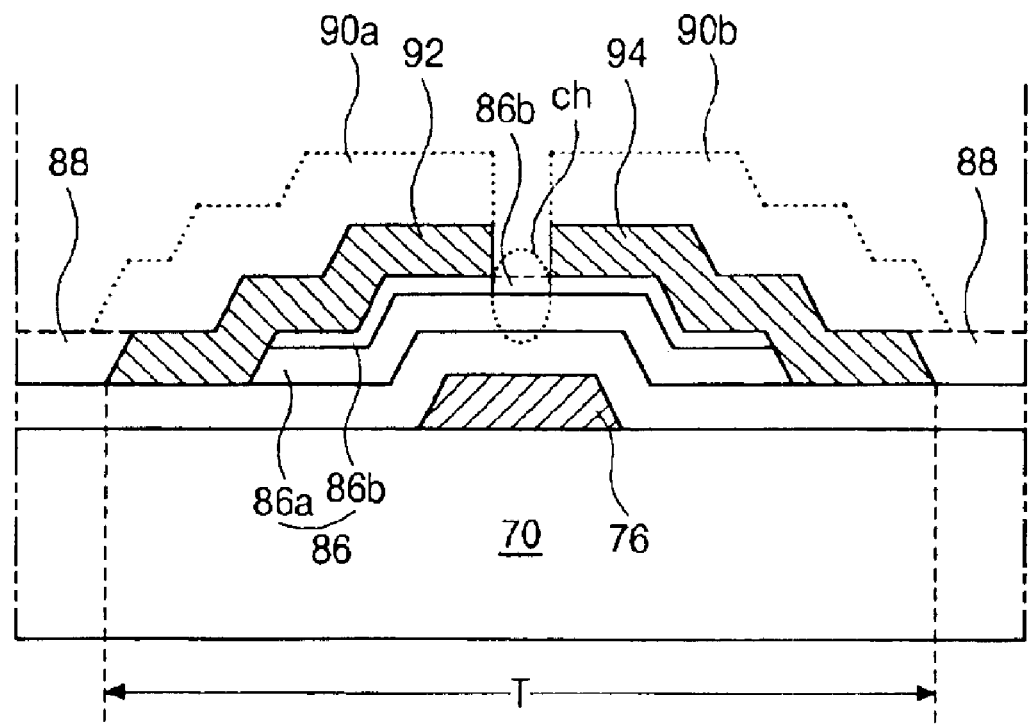
Figure 3A:
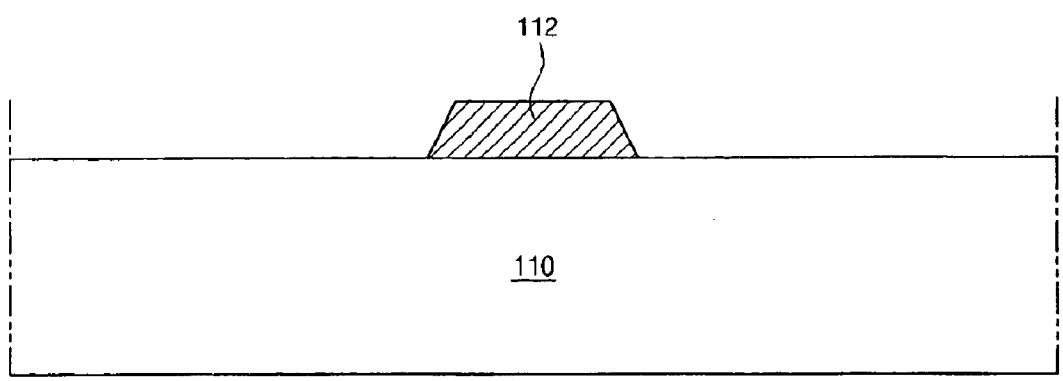
FIGS. 3A to 3F are schematic cross sectional views of an exemplary method of fabricating a bottom-gated type polycrystalline silicon thin film transistor according to the present invention.

FIGS. 3A to 3F are schematic cross sectional views of an exemplary method of fabricating a bottom-gated type polycrystalline silicon thin film transistor according to the present invention. In FIG. 3A, a first metal layer may be formed on a substrate 110. Then, a gate electrode 112 may be formed through a first mask process, wherein the gate electrode 112 may include metallic material having a relatively low resistivity.

Figure 3B:
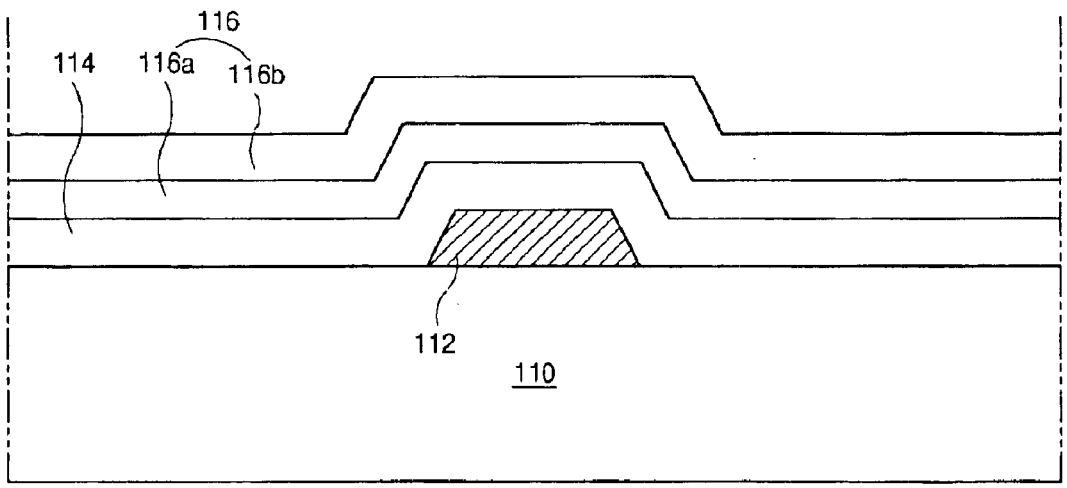

In FIG. 3B, a gate insulating layer 114 and an amorphous silicon layer 116 may be sequentially formed on the gate electrode 112, wherein the amorphous silicon layer 116 may include an intrinsic amorphous silicon layer 116a and an impurity-doped amorphous silicon layer 116b. In addition, hydrogen atoms in the amorphous silicon layer 116 may be removed through a dehydrogenation treatment. In addition, the impurity-doped amorphous silicon layer 116b may be crystallized and etched to form an ohmic contact layer during subsequent processes. Accordingly, the impurity-doped amorphous silicon layer 116b may be formed to have a thickness greater than a thickness of the ohmic contact layer, and the thickness of the impurity-doped amorphous silicon layer 116b may be determined by an etch selectivity ratio of polycrystalline silicon to amorphous silicon.

Figure 3C:
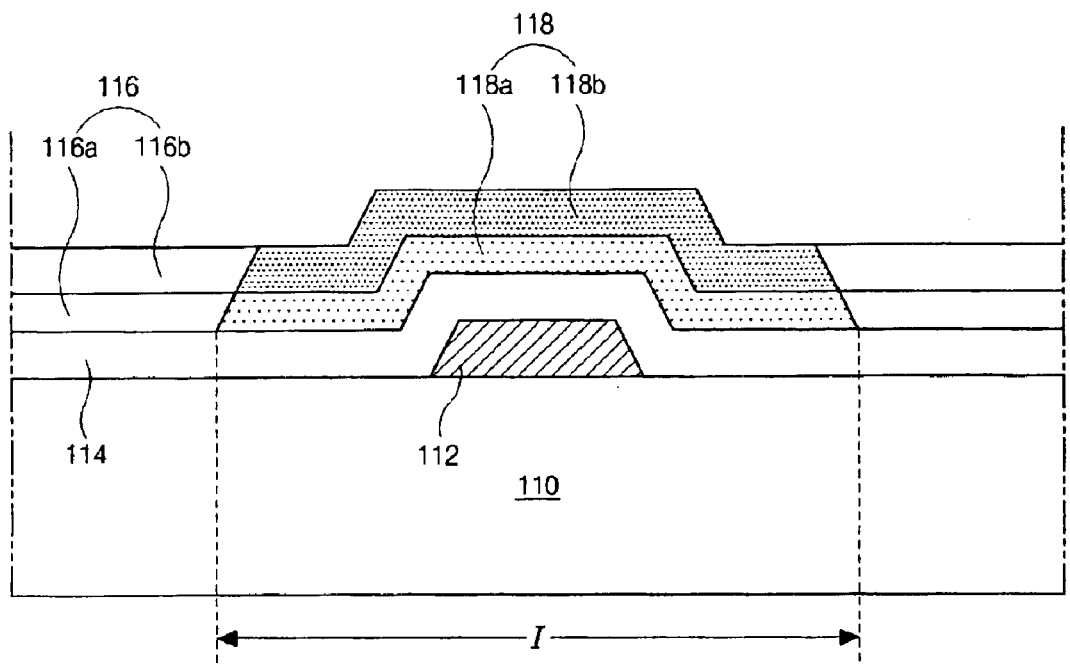

In FIG. 3C, the amorphous silicon layer 116 in a first region "I" corresponding to the gate electrode 112 may be crystallized to form a polycrystalline silicon layer 118. The polycrystalline silicon layer 118 may includes an intrinsic polycrystalline silicon layer 118a and an impurity-doped polycrystalline silicon layer 118b. Although not shown in FIG. 3C, an alignment key may be formed within a non-display area of the substrate 110 when the gate electrode 112 is formed. Accordingly, the amorphous silicon layer 116 in the first region "I" may be selectively crystallized using the alignment key as a reference. In addition, the amorphous silicon layer 116 in the first region "I" may be crystallized using a laser beam having a complete melting energy density or nearly a complete melting energy density.

Figure 3D:
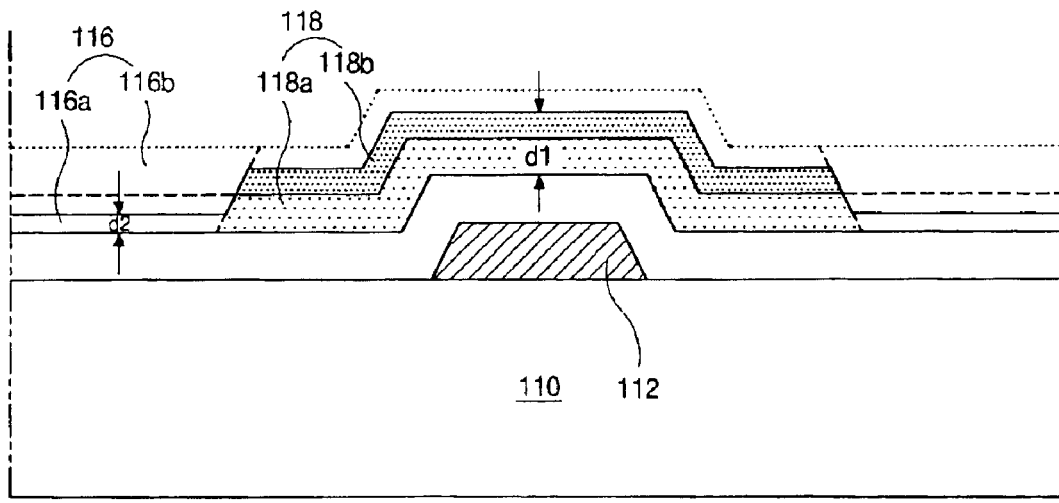
Figure 3E:
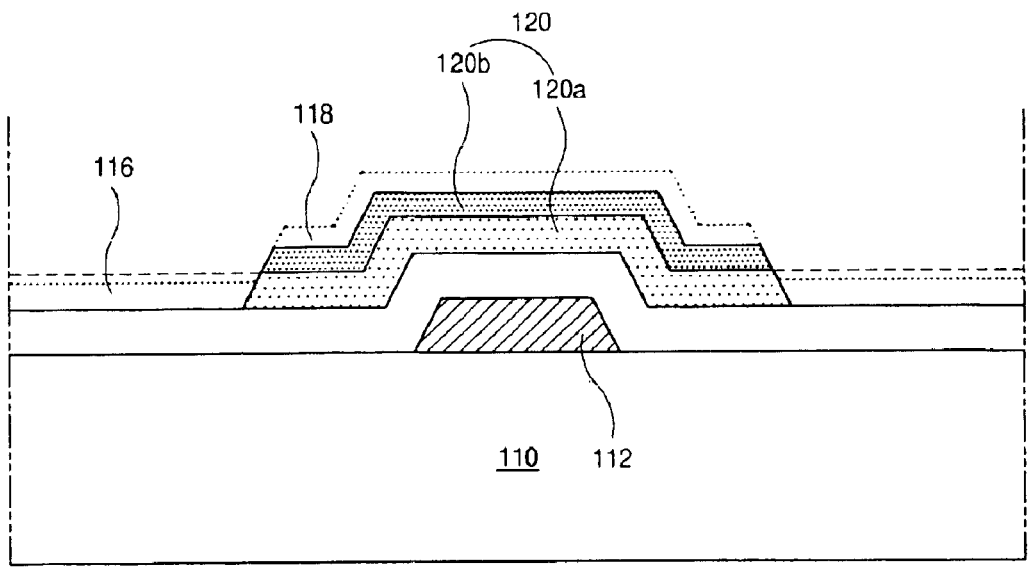

In FIG. 3D, the amorphous silicon layer 116 and the polycrystalline silicon layer 118 may be simultaneously etched under an etch condition where an etch rate of amorphous silicon is greater than an etch rate of polycrystalline silicon. As shown in FIGS. 3D and 3E, an initial etch state of the amorphous silicon layer 116 and the polycrystalline silicon layer 118 are shown as dotted and dashed lines. Since an etch rate of amorphous silicon may be greater than an etch rate of polycrystalline silicon, a first thickness "d1" of a residual polycrystalline silicon layer 118 may be greater than a second thickness "d2" of a residual amorphous silicon layer 116.

In FIG. 3E, the amorphous silicon layer 116 may be completely removed, wherein only the polycrystalline silicon layer 118 may remain to form a semiconductor layer 120. The semiconductor layer 120 may include an active layer 120a of intrinsic polycrystalline silicon and an ohmic contact layer 120b of impurity-doped polycrystalline silicon. For example, an etch selectivity ratio of polycrystalline silicon to amorphous silicon may be within a range of about 0.6 to about 0.8.

Figure 3F:
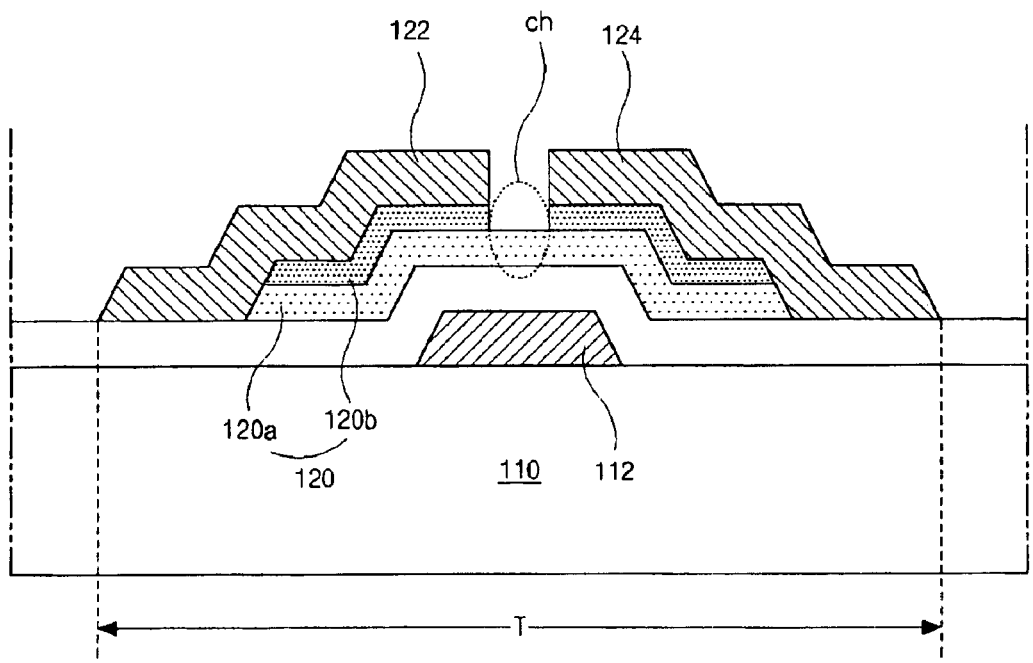

In FIG. 3F, source and drain electrodes 122 and 124 may be formed on the semiconductor layer 120. Accordingly, the ohmic contact layer 120b exposed between the source and drain electrodes 122 and 124 may be removed, and a channel region "ch" of the active layer 120a may be exposed between the source and drain electrodes 122 and 124.

According to the present invention, since the semiconductor layer 120 may be formed without additional photolithographic processes, fabrication of a TFT may be simplified and production costs may be reduced.

Figure 4A:
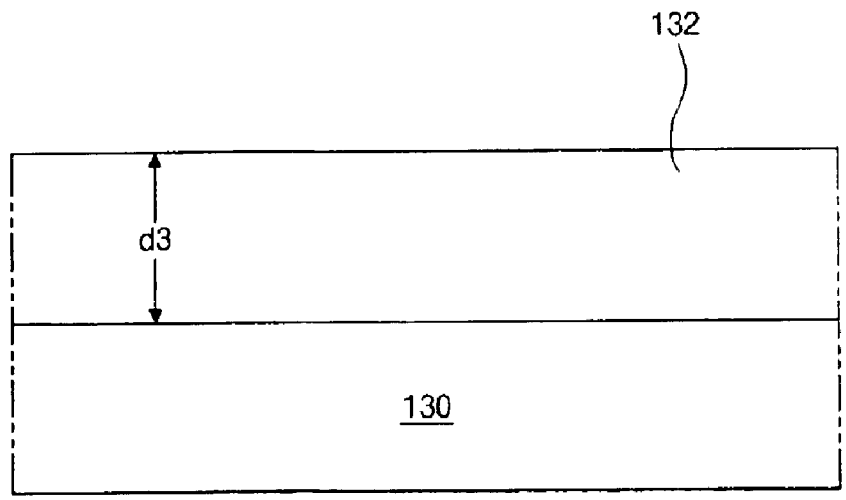
FIGS. 4A to 4C are cross sectional views of an exemplary method of etching a semiconductor layer for a bottom-gated type polycrystalline silicon thin film transistor according to the present invention.
Figure 4B:
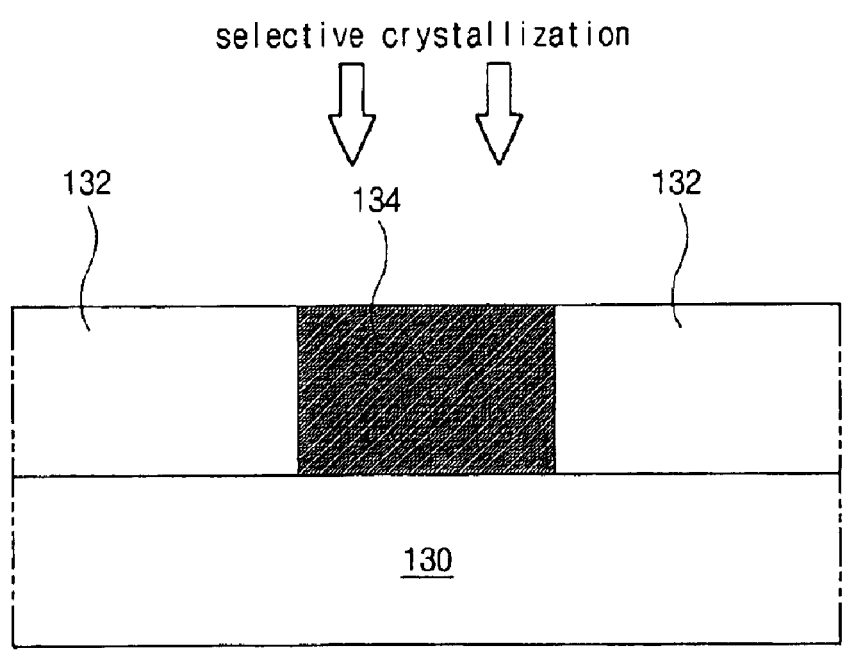
Figure 4C:
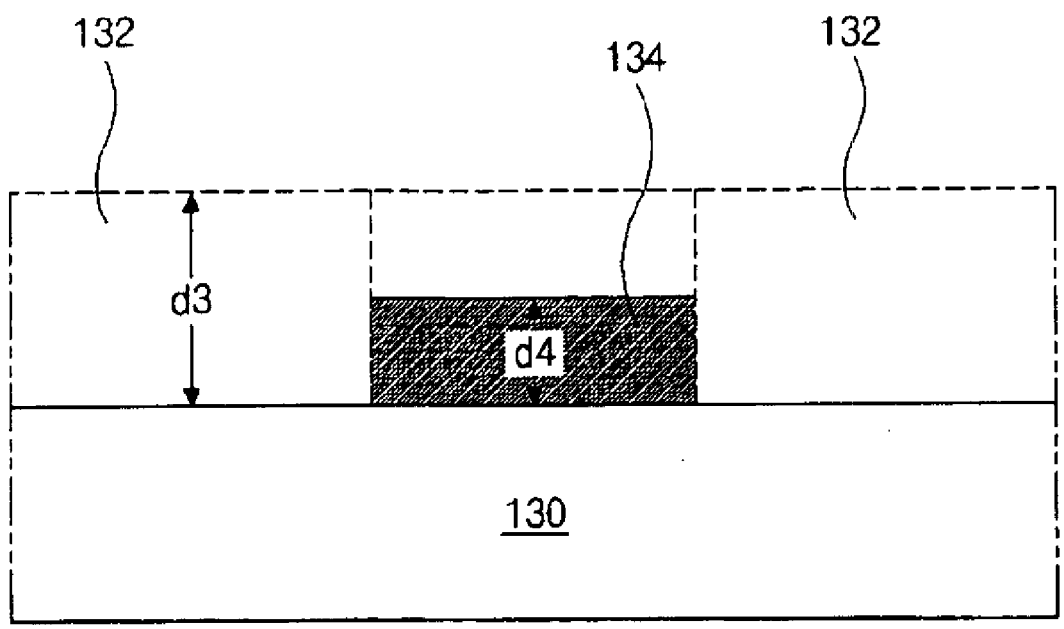

FIGS. 4A to 4C are cross sectional views of an exemplary method of etching a semiconductor layer for a bottom-gated type polycrystalline silicon thin film transistor according to the present invention. In FIG. 4A, an amorphous silicon layer 132 may be formed on a substrate 130 having a third thickness "d3."

In FIG. 4B, a central portion of the amorphous silicon layer 132 may be selectively crystallized to form a polycrystalline silicon layer 134.

In FIG. 4C, the amorphous silicon layer 132 may be completely removed and only the polycrystalline silicon layer 134 having a fourth thickness "d4" may remain. Since the amorphous silicon layer 132 and the polycrystalline silicon layer 134 may be simultaneously etched under an etch condition where an etch rate of amorphous silicon is greater than an etch rate of polycrystalline silicon, the polycrystalline silicon layer 134 may selectively remain.

An etch selectivity ratio of polycrystalline silicon to amorphous silicon may be obtained by:

$$x:1 = (d3-d4):d3, \text{ wherein } x = (d3-d4)/d3 = 1-d4/d3 \quad (1)$$

where d3 is a third thickness of the amorphous silicon layer, d4 is a fourth thickness of the polycrystalline silicon layer, and x:1 is an etch selectivity ratio of polycrystalline silicon to amorphous silicon. Accordingly, the required etch selectivity ratios of polycrystalline silicon to amorphous silicon may be determined from equation (1) when the third thickness "d3" and the fourth thickness "d4" are known.

a) when $d3=1500$ Å and $d4=500$ Å, $x=0.67$ b) when $d3=2000$ Å and $d4=500$ Å, $x=0.75$ c) when $d3=2500$ Å and $d4=400$ Å, $x=0.84$ d) when $d3=1500$ Å and $d4=300$ Å, $x=0.8$ For example, when the amorphous silicon layer is crystallized using a laser apparatus, the amorphous silicon layer has a thickness of about 1500 Å to about 2000 Å. Accordingly, the amorphous silicon layer and the polycrystalline silicon may be etched under an etch selectivity ratio of polycrystalline silicon to amorphous silicon of about 0.6 to about 0.8.

In a bottom-gated type polycrystalline silicon TFT, an amorphous silicon layer in an active region may be selectively crystallized, and the polycrystalline silicon layer and the amorphous silicon layer may be simultaneously etched by adjusting an etch selectivity ratio of polycrystalline silicon to amorphous silicon such that the amorphous silicon layer is completely removed and only the polycrystalline silicon layer remains. Accordingly, the semiconductor layer of polycrystalline silicon may be formed without additional photolithographic processes including steps of coating a PR layer, exposing the PR layer, developing the PR layer, and striping a PR pattern.

Figure 5:
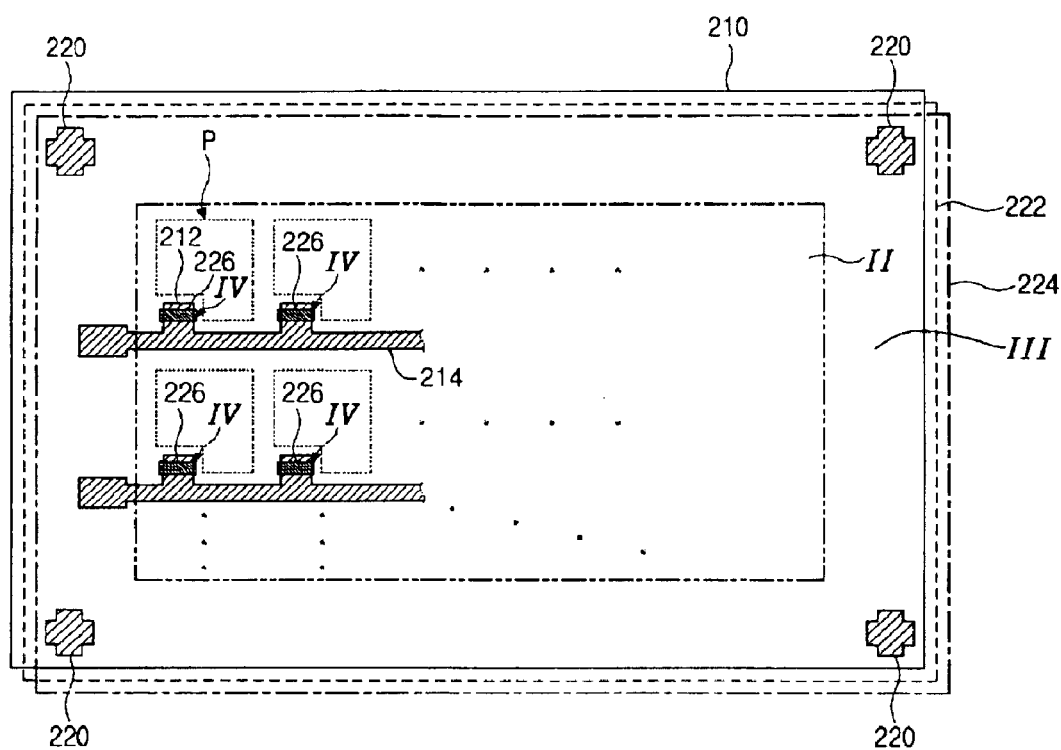
FIG. 5 is a schematic plan view of an exemplary method of crystallizing a semiconductor layer for a bottom-gated type polycrystalline silicon thin film transistor according to the present invention.

FIG. 5 is a schematic plan view of an exemplary method of crystallizing a semiconductor layer for a bottom-gated type polycrystalline silicon thin film transistor according to the present invention. In FIG. 5, a substrate 210 may include a first region "II" and a second region "III" that surrounds the first region "II." In addition, a gate line 214 may be formed on the substrate 210 and a gate electrode 212 connected to the gate line 214 may be formed within a pixel region "P" of a minimum display unit within the first region "II." Furthermore, alignment keys 220 may be formed of the same material and through the same process as the gate line 214 along an edge portion of the second region "III." Moreover, a gate insulating layer 222 and an amorphous silicon layer 224 may be sequentially formed on the gate line 214 and the alignment keys 220. Although not shown in FIG. 5, the amorphous silicon layer 224 may include an intrinsic amorphous silicon layer and an impurity-doped amorphous silicon layer.

In FIG. 5, a polycrystalline silicon layer 226 may be formed in a third region "IV" corresponding to the gate electrode 212. The polycrystalline silicon layer 226 may be formed by selectively crystallizing the amorphous silicon layer 224 using the alignment keys 220 as a reference. Accordingly, the polycrystalline silicon layer 226 may be selectively formed in the third region "IV" using the alignment keys 220, which are formed through a step of forming the gate electrode 214, as a reference without additional photolithographic processes. For example, the first region "II" and the second region "III" may correspond to a display region and a non-display region, respectively, and the third region "IV" may correspond to an active region.

Figure 6:
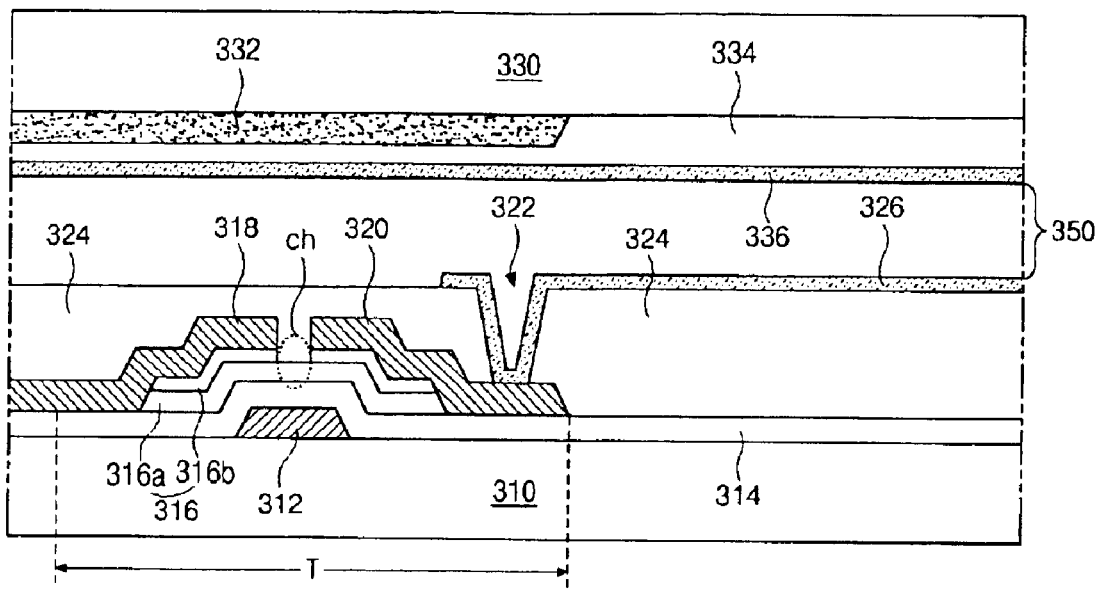
FIG. 6 is a schematic cross sectional view of an exemplary liquid crystal display device including a bottom-gated type polycrystalline silicon thin film transistor according to the present invention.

FIG. 6 is a schematic cross sectional view of an exemplary liquid crystal display device including a bottom-gated type polycrystalline silicon thin film transistor according to the present invention. In FIG. 6, first and second substrates 310 and 330 may face and be spaced apart from each other, wherein a gate electrode 312 may be formed on an inner surface of the first substrate 310 and a gate insulating layer 314 may the gate electrode 312. In addition, a semiconductor layer 316 including an active layer 316a and an ohmic contact layer 316b may be formed on the gate insulating layer 314. The semiconductor layer 316 may be formed through an etch process using an etch selectivity ratio of polycrystalline silicon to amorphous silicon without using additional photolithographic processes.

In FIG. 6, source and drain electrodes 318 and 320 may be formed on the semiconductor layer 316, wherein the ohmic contact layer 316b between the source and drain electrodes 318 and 320 may be removed, and a channel region "ch" of the active layer 316a may be exposed between the source and drain electrodes 318 and 320. The gate electrode 312, the semiconductor layer 316, the source electrode 318, and the drain electrode 320 may constitute a TFT "T."

Next, a passivation layer 324 may be formed on the TFT "T," and a pixel electrode 326 may be formed on the passivation layer 324. The passivation layer 324 may have a drain contact hole 322 exposing the drain electrode 320, and the pixel electrode 326 may be connected to the drain electrode 320 through the drain contact hole 322. Although not shown in FIG. 6, a gate line connected to the gate electrode 312 may be formed along a first direction, and a data line connected to the source electrode 318 may be formed along a second direction perpendicular to the first direction.

Then, a black matrix 332 corresponding to the TFT "T" may be formed on an inner surface of the second substrate 330, and a color filter layer 334 may be formed on the black matrix 332. Next, a common electrode 336 may be formed on the color filter layer 334, and a liquid crystal layer 350 may be formed between the pixel electrode 326 and the common electrode 336. Although not shown in FIG. 6, first and second polarizing plates may be formed along exterior surfaces of the first and second substrates 310 and 330, respectively, and a backlight unit may be disposed under the first polarizing plate.

According to the present invention, an active layer may be selectively crystallized, and a semiconductor layer may be obtained through an etch process using an etch selectivity ratio of polycrystalline silicon to amorphous silicon. Since the semiconductor layer may be formed without using additional photolithographic processes, production yield may be improved due to simplification of fabrication processes, thereby reducing fabrication costs.

It will be apparent to those skilled in the art that various modifications and variations can be made in the method of forming a bottom-gated type polycrystalline silicon thin film transistor of the present invention without departing from the spirit or scope of the invention. Thus, it is intended that the present invention cover the modifications and variations of this invention provided they come within the scope of the appended claims and their equivalents.

What is claimed is:

1. A method of forming a thin film transistor, comprising:
   forming a gate electrode on a substrate;
   forming a gate insulating layer on the gate electrode;
   forming an amorphous silicon layer on the gate insulating layer;
   crystallizing the amorphous silicon layer within an active region corresponding to the gate electrode to form a polycrystalline silicon layer;
   etching the amorphous silicon layer such that an etch rate of amorphous silicon is greater than an etch rate of polycrystalline silicon to form a semiconductor layer of polycrystalline silicon in the active region; and
   forming source and drain electrodes on the semiconductor layer.

2. The method according to claim 1, wherein the forming an amorphous silicon layer includes forming an intrinsic amorphous silicon layer on the gate insulating layer and forming an impurity-doped amorphous silicon layer on the intrinsic amorphous silicon layer.

3. The method according to claim 2, wherein the semiconductor layer includes an active layer of intrinsic polycrystalline silicon and an ohmic contact layer of impurity-doped polycrystalline silicon.

4. The method according to claim 3, wherein a thickness of the impurity-doped amorphous silicon layer is greater than a thickness of the ohmic contact layer.

5. The method according to claim 1, wherein the etch condition has an etch selectivity ratio of polycrystalline silicon to amorphous silicon within a range of about 0.6 to about 0.8.

6. The method according to claim 1, wherein the crystallizing an amorphous silicon layer in the active region includes using a laser apparatus.

7. The method according to claim 1, further comprising forming alignment keys along an edge portion of the substrate.

8. The method according to claim 7, wherein the alignment keys are formed of the same material and the same layer as the gate electrode.

9. The method according to claim 7, wherein the crystallizing an amorphous silicon layer in the active region includes using the alignments keys as a reference.

10. A method of fabricating a liquid crystal display device, comprising:
    forming a gate electrode and a gate line connected to the gate electrode on a first substrate;
    forming a gate insulating layer on the gate electrode and the gate line;
    forming an amorphous silicon layer on the gate insulating layer;
    crystallizing the amorphous silicon layer in an active region corresponding to the gate electrode to form a polycrystalline silicon layer;
    etching the amorphous silicon layer such that an etch rate of amorphous silicon is greater than an etch rate of polycrystalline silicon to form a semiconductor layer of polycrystalline silicon in the active region;
    forming source and drain electrodes on the semiconductor layer and a data line connected to the source electrode;
    forming a passivation layer on the source electrode, the drain electrode, and the data line;
    forming a pixel electrode on the passivation layer;
    forming a black matrix on a second substrate;
    forming a color filter layer on the black matrix;
    forming a common electrode on the color filter layer;
    attaching the first substrate and the second substrate such that the pixel electrode faces the common electrode; and
    forming a liquid crystal layer between the pixel electrode and the common electrode.

11. The method according to claim 10, wherein the forming an amorphous silicon layer includes forming an intrinsic amorphous silicon layer on the gate insulating layer and forming an impurity-doped amorphous silicon layer on the intrinsic amorphous silicon layer.

12. The method according to claim 11, wherein the semiconductor layer includes an active layer of intrinsic polycrystalline silicon and an ohmic contact layer of impurity-doped polycrystalline silicon.

13. The method according to claim 12, wherein a thickness of the impurity-doped amorphous silicon layer is greater than a thickness of the ohmic contact layer.

14. The method according to claim 10, wherein the etch condition has an etch selectivity ratio of polycrystalline silicon to amorphous silicon within a range of about 0.6 to about 0.8.

15. The method according to claim 10, wherein the crystallizing an amorphous silicon layer in the active region includes using a laser apparatus.

16. The method according to claim 10, further comprising forming alignment keys along an edge portion of the substrate.

17. The method according to claim 16, wherein the alignment keys are formed of the same material and the same layer as the gate electrode.

18. The method according to claim 16, wherein the crystallizing an amorphous silicon layer in the active region includes use the alignment keys as a reference.

* * * * *